US009679995B2

(12) United States Patent
Yu et al.

(10) Patent No.: US 9,679,995 B2
(45) Date of Patent: Jun. 13, 2017

(54) METHOD FOR MANUFACTURING THIN FILM TRANSISTOR AND PIXEL UNIT THEREOF

(71) Applicant: SHENZHEN ROYOLE TECHNOLOGIES CO., LTD., Shenzhen (CN)

(72) Inventors: Xiaojun Yu, Shenzhen (CN); Peng Wei, Shenzhen (CN); Zihong Liu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/778,920

(22) PCT Filed: Mar. 22, 2013

(86) PCT No.: PCT/CN2013/073054
§ 371 (c)(1),
(2) Date: Sep. 21, 2015

(87) PCT Pub. No.: WO2014/146291
PCT Pub. Date: Sep. 25, 2014

(65) Prior Publication Data
US 2016/0049500 A1    Feb. 18, 2016

(51) Int. Cl.
H01L 21/16    (2006.01)
H01L 29/66    (2006.01)
(Continued)

(52) U.S. Cl.
CPC .... *H01L 29/66969* (2013.01); *H01L 21/0272* (2013.01); *H01L 21/47635* (2013.01);
(Continued)

(58) Field of Classification Search
CPC ...... H01L 29/66; H01L 21/4763; H01L 27/12
See application file for complete search history.

(56) References Cited

U.S. PATENT DOCUMENTS 6,528,816 B1 * 3/2003 Jackson ............. H01L 27/1214
257/368
8,119,463 B2    2/2012 Koo

FOREIGN PATENT DOCUMENTS

CN    101488459    7/2009
CN    101533779    9/2009

OTHER PUBLICATIONS

International Search Report of PCT/CN2013/073054, dated Jan. 2, 2014 and English language translation, 6 pages total.

* cited by examiner

*Primary Examiner* — Elias M Ullah
(74) *Attorney, Agent, or Firm* — Hamre, Schumann, Mueller & Larson, P.C.

(57) ABSTRACT

The present invention is suitable to the field of electronic technology, and provides a method of manufacturing a thin film transistor and a pixel unit thereof, wherein when the thin film transistor is manufactured, the gate metal layer is used as a mask, and exposed from the back of the substrate to position the channel and the source and drain of the thin film transistor, so that the channel is self-aligned with the gate, and the source and drain are self-aligned with the gate and are symmetrical, and the thin film transistor thus manufactured has a small parasitic capacitance, and the circuit manufactured therewith is fast in operation, and less prone to occurring short circuit or open circuit. In the present invention, the characteristics that the channel is self-aligned with the gate, and the source and drain are self-aligned with the gate and are symmetrical avoid the alignment precision requirement on the mask plate in the production, thus (Continued)

reducing the need for the high precision lithographic apparatus, and reducing the costs and increasing the yield. In addition, the present process is suitable for manufacturing a pixel unit of a thin film transistor, the manufacturing process only requires four mask sets which do not require the critical alignment. As compared with other four mask processes which use the gray tone masks, the present process can increase the yield and reduce the costs.

8 Claims, 13 Drawing Sheets

(51) Int. Cl.
    *H01L 21/027*     (2006.01)
    *H01L 27/12*     (2006.01)
    *H01L 21/4763*     (2006.01)
    *H01L 29/423*     (2006.01)
    *H01L 29/786*     (2006.01)

(52) U.S. Cl.
    CPC ........ *H01L 27/127* (2013.01); *H01L 27/1225* (2013.01); *H01L 27/1255* (2013.01); *H01L 27/1288* (2013.01); *H01L 29/42384* (2013.01); *H01L 29/66765* (2013.01); *H01L 29/7869* (2013.01); *H01L 29/78696* (2013.01)

METHOD FOR MANUFACTURING THIN FILM TRANSISTOR AND PIXEL UNIT THEREOF

TECHNICAL FIELD

The present invention belongs to the field of electronic technology, in particular to a method for manufacturing a thin film transistor and a pixel unit thereof

BACKGROUND

Thin film transistor (TFT), such as In—Ga—Zn—O (IGZO) TFT, is a basic circuit component which can be widely applied in a variety of electronic systems, and has many advantages, such as high electron mobility, low temperature manufacturing process, high stability, transparency, and so on. However, in the prior process for manufacturing a thin film transistor, due to the increased overlaps between the gate and the source and drain, the gate-source parasitic capacitance is high, so that the overall performance of the thin film transistor is poor. Further, there is a high alignment requirement on the mask plate in the prior process for manufacturing a thin film transistor, with a low yield and high costs. Also there is a high alignment precision requirement on the mask plate in the four-mask TFT process which use the gray tone masks, thus also affecting the yield and the costs.

SUMMARY

An object of the embodiment of the present invention is to provide a method for manufacturing a thin film transistor, and is intended to solve the poor performance problem of the thin-film transistor manufactured by the prior art.

The embodiment of the present invention can be carried out as follows, a method for manufacturing a thin film transistor, comprising the steps of:

using the gate metal layer as a mask, exposing from the back of the substrate, and self-aligning the channel of the thin film transistor and the gate;

forming the source and drain self-aligned with the gate via a metal lift-off process;

depositing a passivation layer, and manufacturing the source and drain contact via holes;

wherein, the channel is the metal oxide layer aligned with the gate of the thin film transistor.

Another object of the embodiment of the present invention is to provide a method for manufacturing a pixel unit of a thin film transistor, comprising the steps of:

using the gate metal layer, gate lead metal layer and the storage capacitor electrode metal layer as a mask, exposing and developing from the back of the substrate, and self-aligning the channel of the thin film transistor with the gate;

forming the source and drain self-aligned with the gate via a metal lift-off process;

depositing a passivation layer, and manufacturing the source and drain contact via hole leads, the via gate contact hole lead and the other electrode of the storage capacitor;

wherein, the channel is the metal oxide layer aligned with the gate of the thin film transistor.

In the embodiment of the present invention, the gate metal layer is used as a mask, exposed form the back of the substrate to position the channel of the thin film transistor and the source and drain. In particular, firstly, the gate metal layer is used as a mask, exposed from the back of the substrate, and self-aligned the channel of the thin film transistor with the gate; then the source and drain self-aligned with the gate are formed via a metal lift-off process; finally, a passivation layer is deposited, and the source and drain contact via hole leads are manufactured; wherein the channel is the metal oxide layer aligned with the gate of the thin film transistor, so that the channel is self-aligned with the gate, and the source and drain are self-aligned with the gate and are symmetrical, the thin film transistor thus manufactured has a small parasitic capacitance, and the circuit manufactured therewith is fast in operation, and less prone to occurring short circuit and open circuit. In the embodiment of the present invention, the characteristics that the channel is self-aligned with the gate and the source and drain are self-aligned with the gate and are symmetrical avoid the alignment precision requirement on the mask plate in the production, thus reducing the need for the high precision photolithography apparatus, and reducing the costs and improving the yield. In addition, the present process is suitable for manufacturing a pixel unit of a thin film transistor, and the manufacturing process only requires four masks plates which do not require the critical alignment. As compared with other four mask processes which use the gray tone masks, the present process can improve the yield and reduce the costs.

DESCRIPTION OF EMBODIMENTS

In order to make the objects, technical solutions and advantages of the present invention more apparent, the present invention is further described in detail in combination with the following accompanying drawings and examples. It should be understood that the specific embodiments described herein are merely to illustrate the present invention and are not intended to limit the same.

In the embodiment of the present invention, the gate metal layer is used as a mask, exposed from the back of the substrate to position the channel of the thin film transistor and the source and drain. Particularly, firstly the gate metal layer is used as a mask, exposed from the back of the substrate, and self-aligned the channel of the thin film transistor with the gate; then the source and drain self-aligned with the gate are formed via a metal lift-off process; finally, the passivation layer is deposited, and source and drain contact via holes are manufactured; wherein the channel is the metal oxide layer aligned with the gate of the thin film transistor, so that the channel is self-aligned with the gate, the source and drain are self-aligned with the gate and are symmetrical, and the thin film transistor thus manufactured has a small parasitic capacitance, and the circuit manufactured therewith is fast in operation, and less prone to occurring short circuit and open circuit. In the present invention, the characteristics that the channel is self-aligned with the gate, and the source and drain are self-aligned with the gate and are symmetrical, avoid the alignment precision requirement on the mask plate in the production, thus reducing the need for the high precision lithographic apparatus, and reducing the costs and increasing the yield. In addition, the present process is suitable for manufacturing a pixel unit of a thin-film-transistor, the manufacturing process only requires four mask sets which do not require the critical alignment. As compared with other four-mask process which use the gray tone masks, the present process can increase the yield and reduce the costs.

The implementation of the present invention will be described below in detail with the metal oxide thin film transistor as an example.

Example 1

Figure 1:
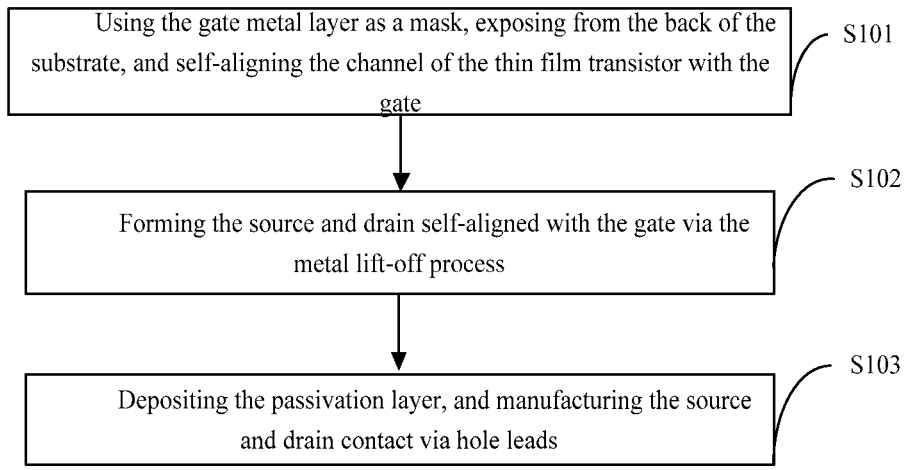
FIG. 1 is a flow chart of the method of manufacturing the thin film transistor according to the first embodiment of the present invention.

FIG. 1 illustrates a flow chart of the method for manufacturing a thin film transistor according to the embodiment of the present invention, described below in detail.

In step S101, the gate metal layer is used as a mask, exposed from the back of the substrate, and self-aligned the channel of the thin film transistor with the gate.

Figure 2:
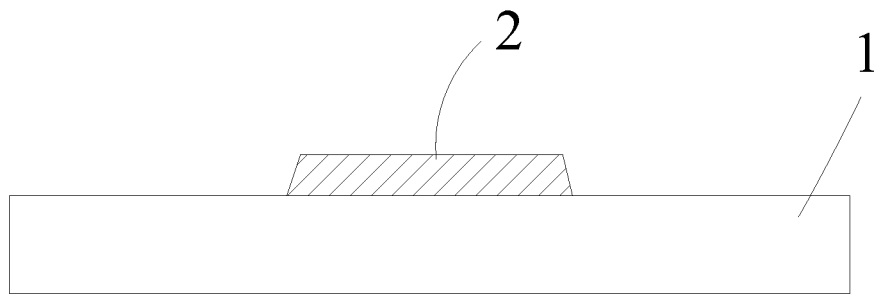
FIG. 2 is a schematic structural diagram according to the first embodiment of the present invention showing that the gate metal layer is formed on the substrate.
Figure 3:
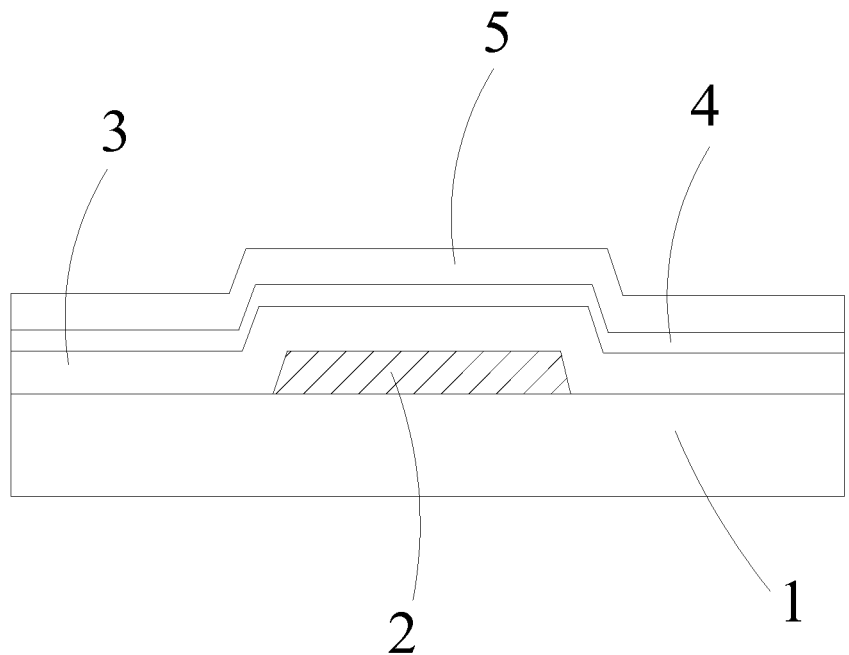
FIG. 3 is a schematic structural diagram according to the first embodiment of the present invention showing that the gate insulating layer, the metal oxide layer and the etch stop layer are deposited on the substrate and the gate metal layer.

As shown in FIG. 2, in the embodiment of the present invention, firstly the gate metal layer 2 is deposited on the substrate 1, wherein the material of the substrate 1 can be glass, transparent plastic or the like. If the substrate 1 is large, it is necessary to etch away the metal layer outside the gate region of the thin film transistor. Here the first mask plate can be used to etch away the metal layer outside the gate region of the thin film transistor. Then, the gate insulating layer 3, the metal oxide layer 4 and the etch stop layer 5 are sequentially deposited on the substrate 1 and the gate metal layer 2, as shown in FIG. 3.

It should be noted that the gate insulating layer 3, the metal oxide layer 4 and the etch stop layer 5 are all a transparent material, and the gate metal layer is formed by the deposition of an opaque material, thus facilitating the exposure from the back of the substrate 1 in the later process.

Figure 4:
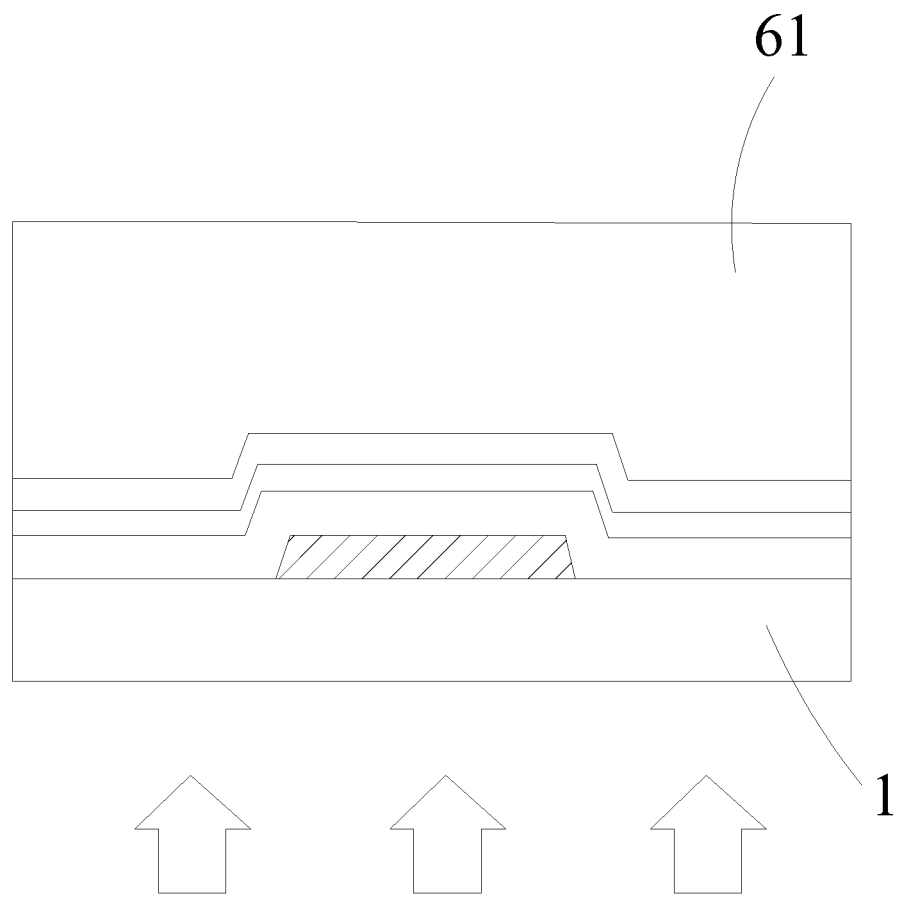
FIG. 4 is a schematic diagram according to the first embodiment of the present invention, showing the exposure from the back the substrate.
Figure 5:
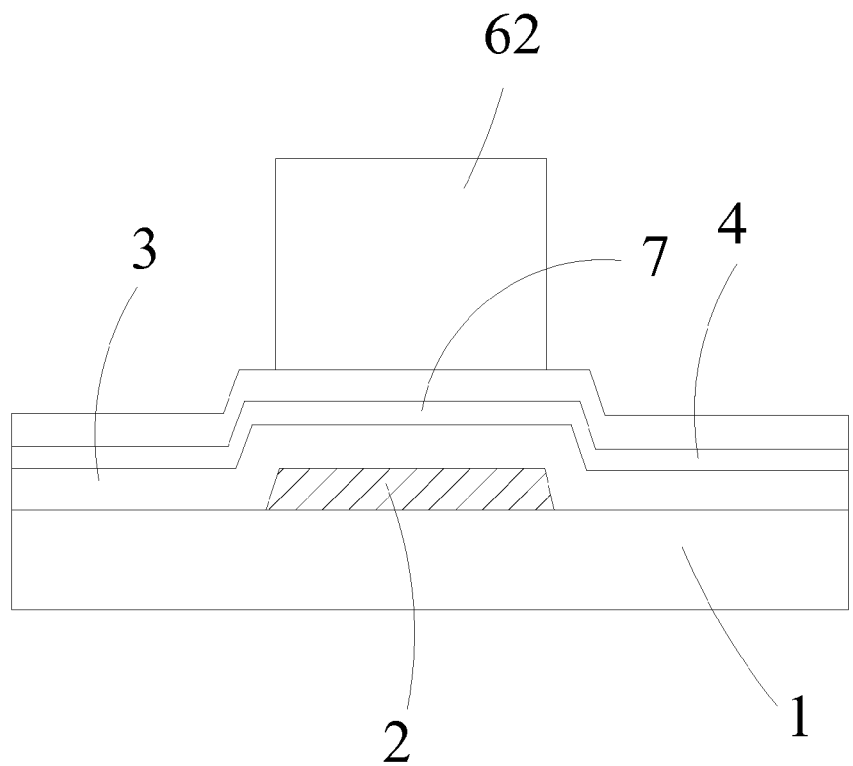
FIG. 5 is a schematic structural diagram after exposing and developing from the back of the substrate according to the first embodiment of the invention.

Next, the photoresist 61 is applied to the etch stop layer 5, herein the gate metal layer 2 is used as a mask, exposed from the back of the substrate 1 so as to expose the etch stop layer outside the gate region, as shown in FIGS. 4 and 5. The gate metal layer 2 is opaque, so that photoresist 62 located on the gate region is retained.

Figure 6:
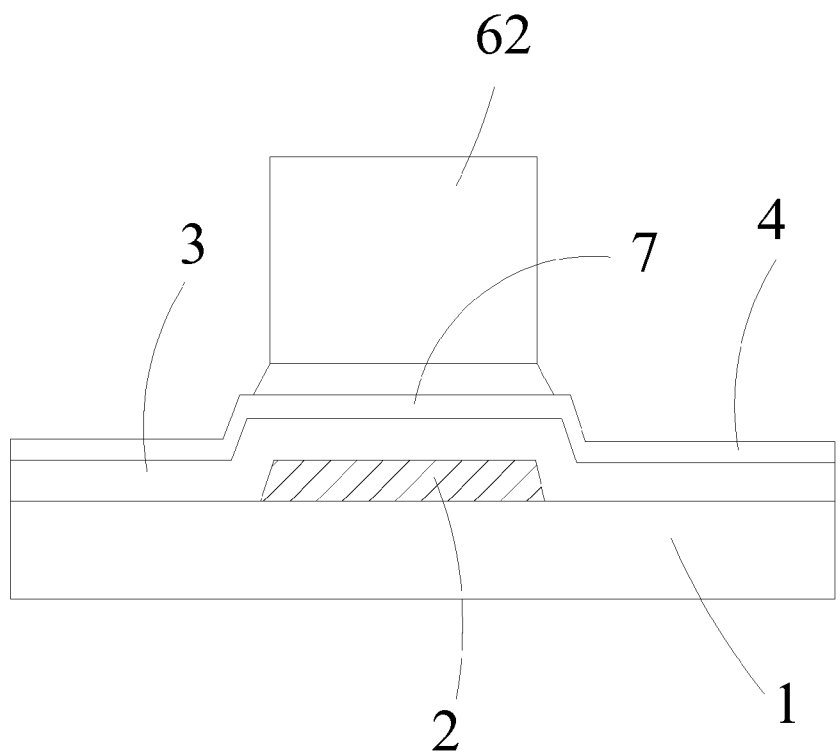
FIG. 6 is a schematic structural diagram according to the first embodiment of the present invention showing that the exposed etch stop layer is removed.

Then, the etch stop layer outside the gate region is removed to expose the metal oxide layer aligned with the etch stop layer, and the channel 7 self-aligned with the gate 2 (i.e., the gate metal layer) of the thin film transistor is formed, as shown in FIG. 6. Herein, the metal oxide layer aligned with the gate of the thin film transistor is directly used as the channel 7, and the process is simple. As the unexposed metal oxide layer (i.e. the channel) is aligned with the etch stop layer located on the gate region, and the etch stop layer located on the gate region is aligned with the gate 2 of the thin film transistor, the channel 7 is precisely aligned with the gate 2 (i.e., the etch stop layer located on the gate region is precisely aligned with the gate metal layer), with an edge spacing between 0~1 um, and an extremely high self-alignment precision.

In step S102, the source and drain self-aligned with the gate are formed via a metal lift-off process.

Figure 7:
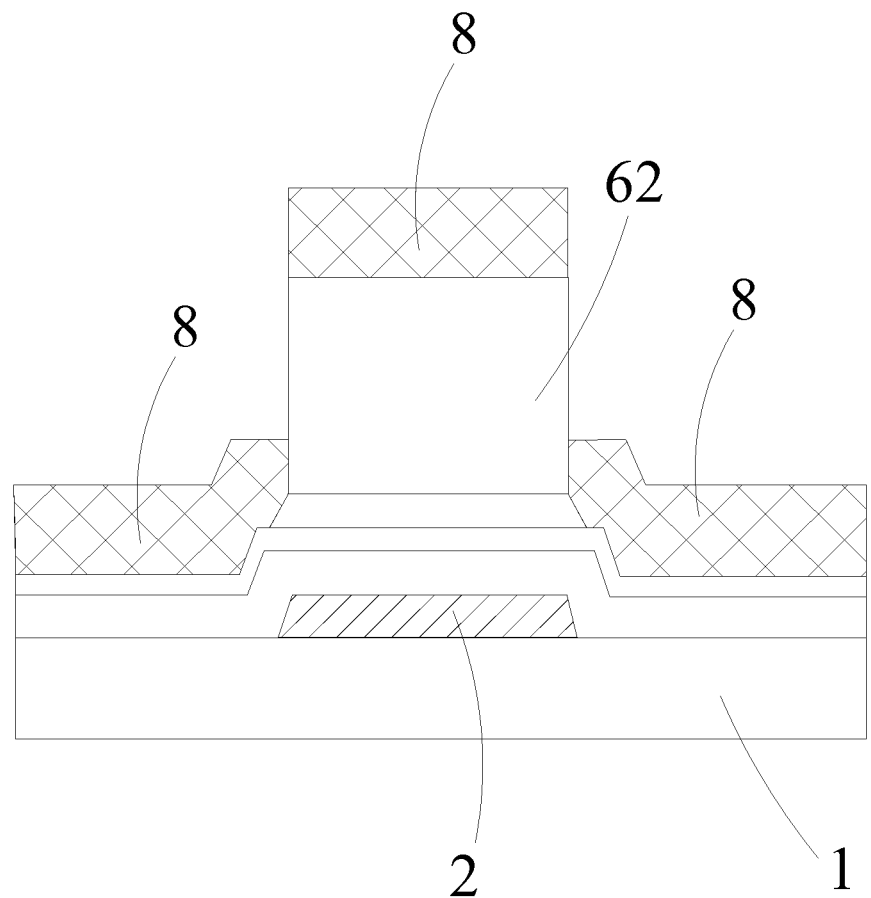
FIG. 7 is a schematic structural diagram after depositing the metal on the photoresist located on the gate region and both sides thereof according to the first embodiment of the present invention.

As shown in FIG. 7, in the embodiment of the present invention, firstly the metal 8 is deposited on one side of the substrate 1 (i.e., on the photoresist 62 on the gate region and both sides of the same), and the metal 8 located on both sides of the photoresist 62 is the source and drain metal self-aligned with the gate 2. As the source and drain metals are formed by the deposition with the side of the photoresist 62 located on the gate region as a boundary, and the etch stop layer is defined by the gate metal layer aligned with the photoresist 62, the edges of the source and drain metals are precisely aligned with the edge of etch stop layer (i.e., the subsequently formed source and drain are self-aligned with the gate and are symmetrical), with a spacing therebetween of less than 1 um, and an extremely high self-alignment precision. In this way the overlapping area between the source and drain metals and the gate can be precisely controlled at 1~2 um, which is much higher than the alignment precisions of other manners. As such, the gate metal layer 2 (i.e., gate) is used as a mask, exposed from the back of the substrate 1 to position the channel of the thin film transistor and the source and drain, so that the channel 7 is self-aligned with the gate 2 and the source and drain are self-aligned with the gate 2 and are symmetrical, and the thin film transistor thus manufactured has a small parasitic capacitance, the circuit manufactured therewith is fast in operation, and less prone to occurring short circuit and open circuit. In summary, in the embodiment of the present invention, the self-alignment process can minimize the overlapping between the gate and the source and drain, and the channel size can be precisely controlled, thus significantly reducing the channel size, and improving the device performance.

Figure 8:
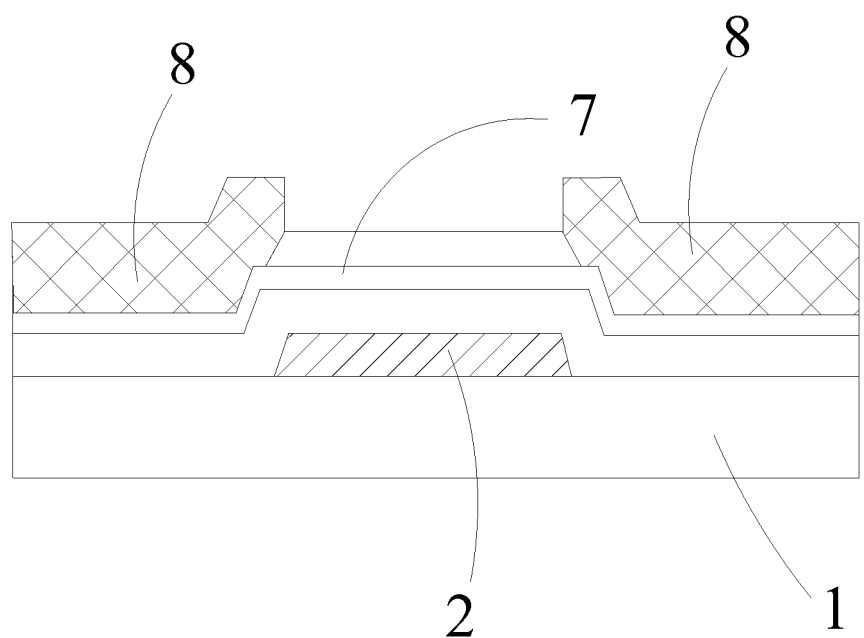
FIG. 8 is a schematic structural diagram according to the first embodiment of the present invention showing that the photoresist located on the gate region and the metal thereon are removed.

Next, the metal 8 deposited on the photoresist and the photoresist 62 located on the gate region is lift off to expose the etch stop layer located on the channel region, which is referred to as a metal lift-off process, as shown in FIG. 8. From the foregoing, it can be understood that the metal lift-off process according to the embodiment of the present invention refers to that before depositing the metal, a photoresist is pre-reserved at a place on which the metal is not necessarily deposited (which is achieved mainly through applying the photoresist, and exposing and developing); and after depositing the metal, the photoresist and the metal thereon are lift off.

Figure 9:
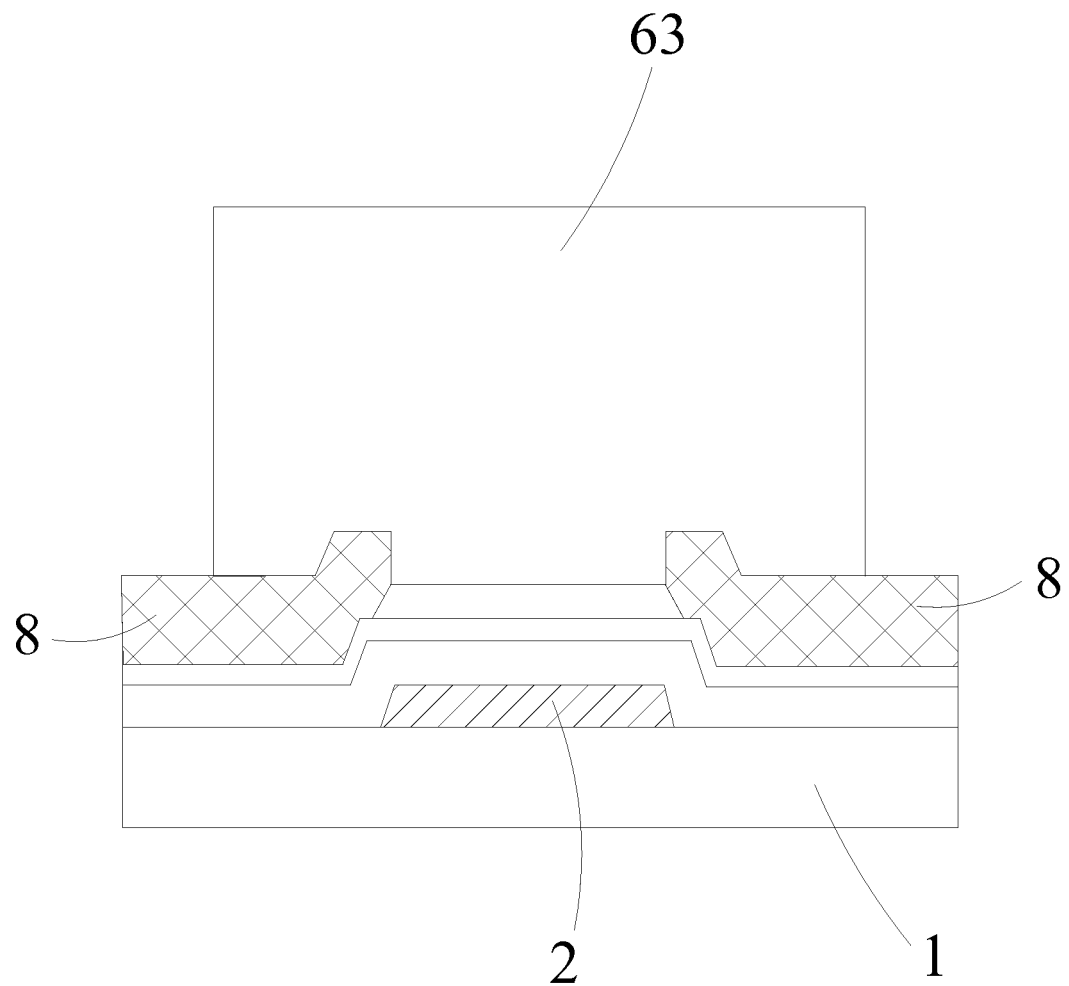
FIG. 9 is a schematic structural diagram after applying the photoresist used to cover the gate region and the source and drain regions on one side of the substrate, and exposing and developing according to the first embodiment of the present invention.

Next, the photoresist used to cover the gate region and the source and drain regions is applied on one side of the substrate 1, a second mask is used, and exposed from the front side, so as to expose a part of the source and drain metals, and at the same time retain a part of the photoresist 63, as shown in FIG. 9. Among them, the sizes of the exposed source and drain metals depend on the sizes of the source and drain to be formed.

Figure 10:
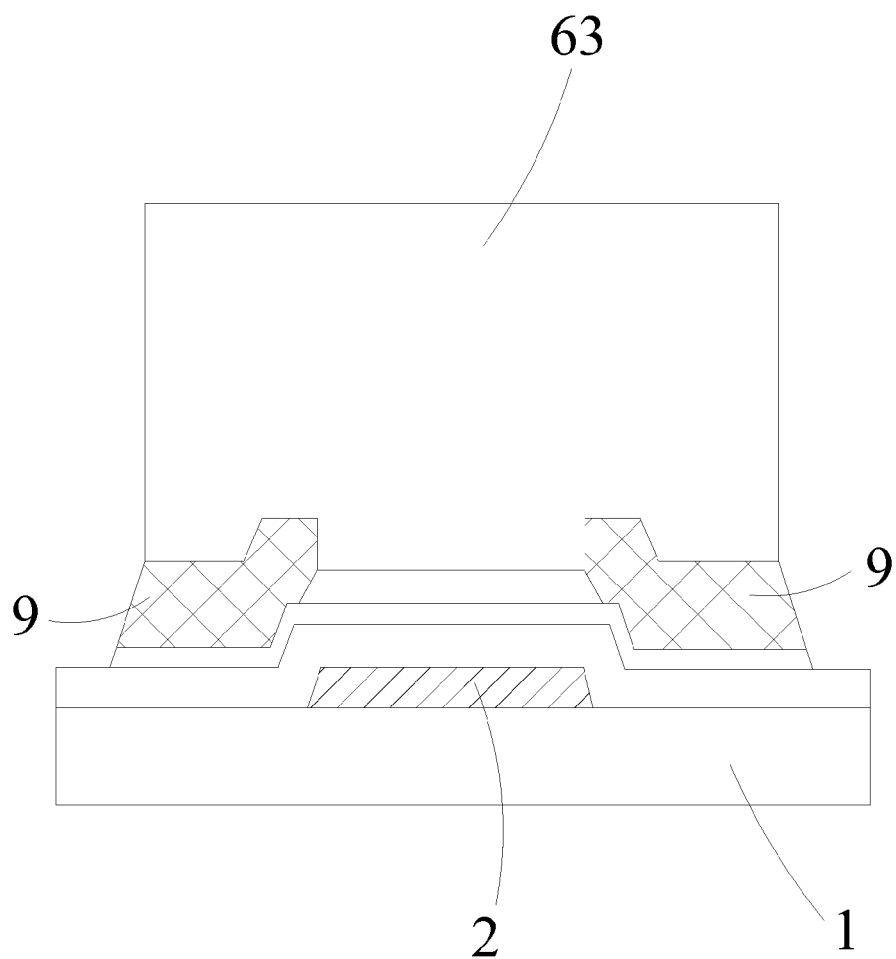
FIG. 10 is a schematic structural diagram according to the first embodiment of the present invention showing that the exposed source and drain metals and the metal oxide layer aligned with the same are etched.
Figure 11:
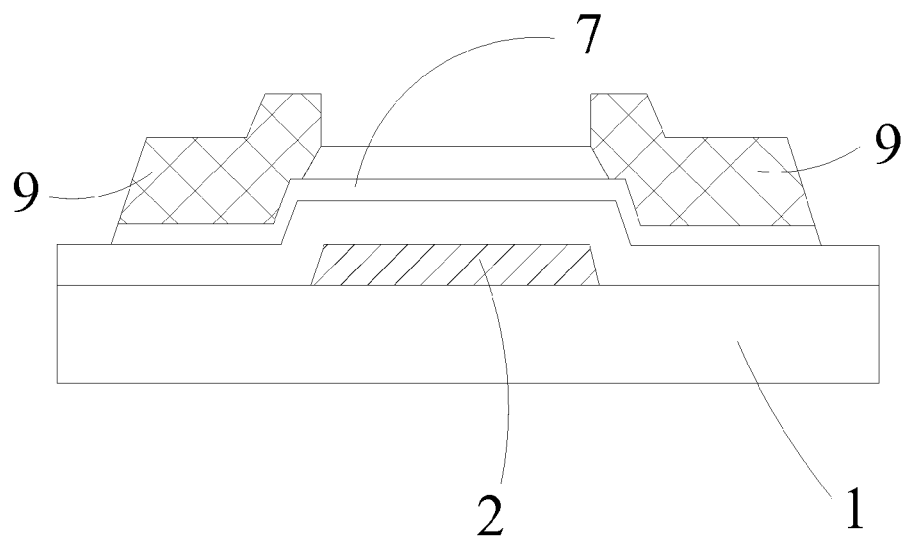
FIG. 11 is a schematic structural diagram after removing the photoresist used to cover the gate region and the source and drain regions according to the first embodiment of the present invention.

Finally, the exposed source and drain metals and the metal oxide layer aligned with the source and a drain metals are removed, so as to form the source and drain 9 of the thin film transistor, then photoresist 63 covering the gate region and the source and drain regions is removed. Particularly, firstly the exposed source and drain metals are etched away, so as to form the source and drain 9 of the thin film transistor, then the metal oxide layer aligned with the exposed source and drain metals is etched away, as shown in FIG. 10. Then, the photoresist 63 covering the gate region and the source and drain regions abovementioned is removed, as shown in FIG. 11. It should be noted that when one side of the gate is the source, the other side is the drain In step S103, the passivation layer is deposited, and the source and drain contact via hole leads are manufactured.

Figure 12:
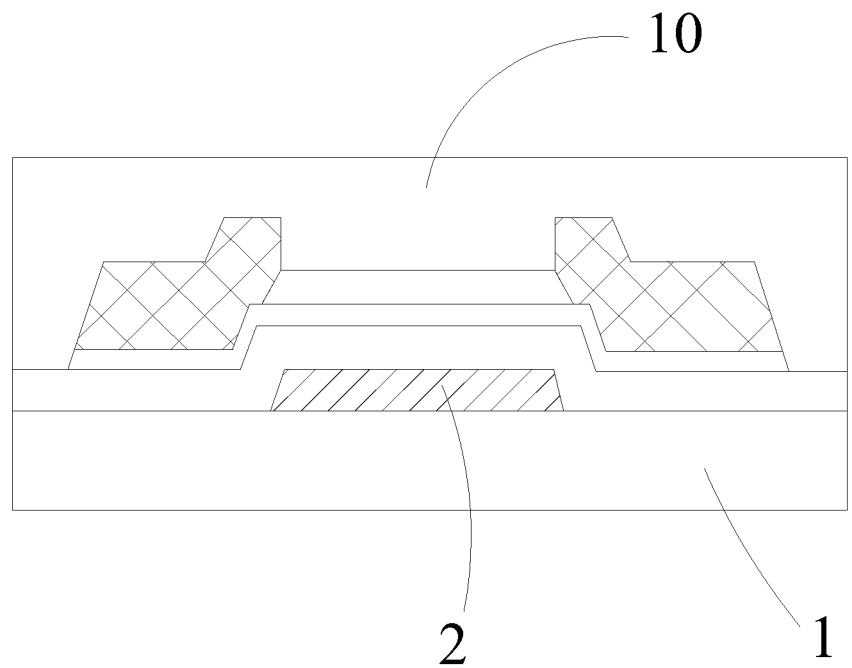
FIG. 12 is a schematic structural diagram according to the first embodiment of the present invention showing that the passivation layer is deposited on one side of the substrate.

As shown in FIG. 12, in the embodiment of the present invention, the passivation layer 10 used to protect the gate 2, the source and drain 9 and the channel 7 formed in the preceding steps is deposited on one side of the substrate 1, wherein the passivation layer 10 covers the channel region and the source and drain 9 of the thin film transistor.

Figure 13:
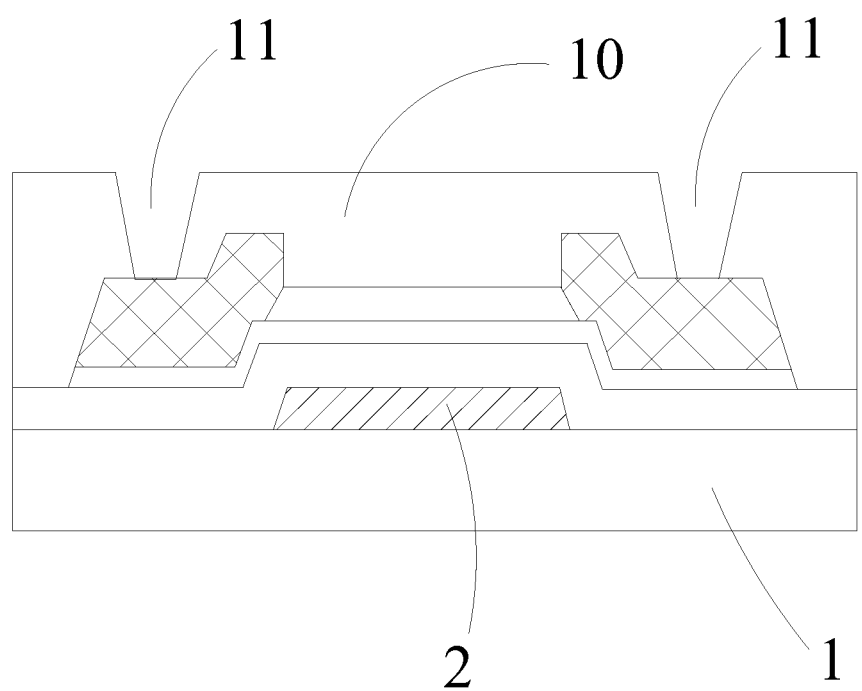
FIG. 13 is a schematic structural diagram according to a first embodiment of the present invention showing that the source and drain contact via holes are etched on the passivation layer.

As shown in FIG. 13, in the embodiment of the present invention, a third mask plate is used to etch the passivation layer 10 located on the source and drain regions so as to form the source and drain contact via holes 11 which are straight through the source and drain 9. Among them, the source and drain contact via holes 11 have an inverted trapezoidal shape in cross-section so as to facilitate filling a electrically conductive material in the later process.

Figure 14:
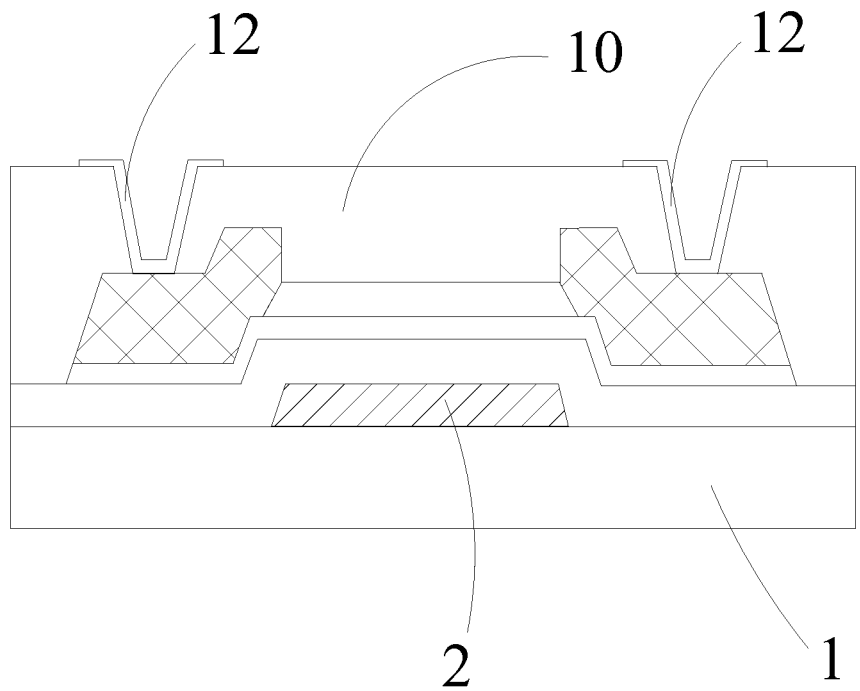
FIG. 14 is a schematic structural diagram according to the first embodiment of the present invention showing that the electrically conductive material is deposited in the source and drain contact via holes.

As shown in FIG. 14, in the embodiment of the present invention, the electrically conductive material 12 is deposited in the source and drain contact via holes 11 formed in the previous steps so as to form the source and drain contact via hole leads. Among them, the electrically conductive material 12 can be a transparent electrically conductive material, such as ITO or the like.

Example 2

Figure 15:
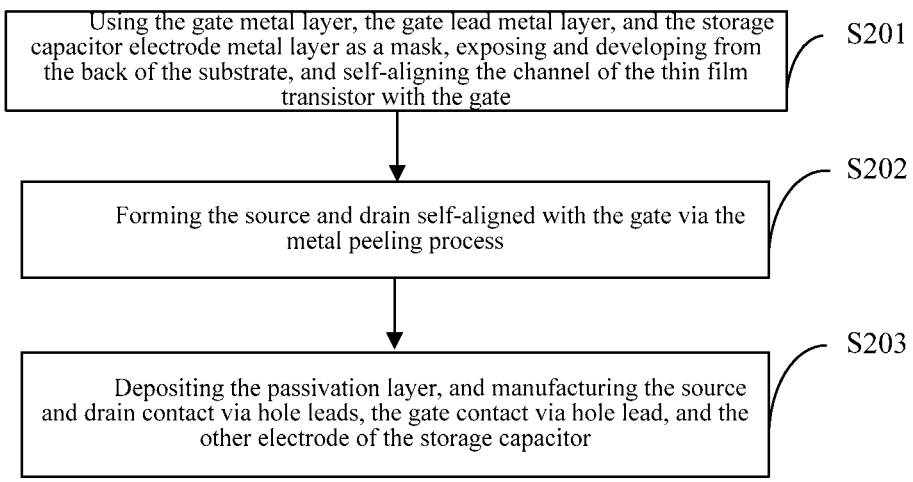
FIG. 15 is a flow chart of the process for manufacturing a pixel unit of a thin film transistor according to the second embodiment of the present invention.

FIG. 15 shows a flow chart of the method for manufacturing the pixel unit of a thin film transistor according to the embodiment of the present invention, described below in detail.

In step S201, the gate metal layer, the gate lead metal layer and the storage capacitor electrode metal layer are used as a mask, exposed from the back of the substrate, and self-aligned the channel of the thin film transistor with the gate.

Figure 16:
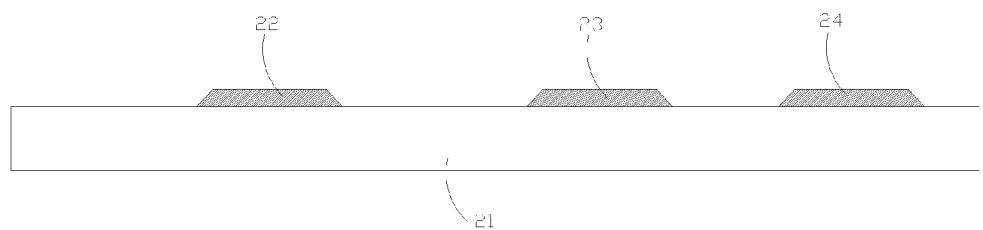
FIG. 16 is a schematic structural diagram according to the second embodiment of the present invention showing that the gate metal layer, the gate lead metal layer and the storage capacitor electrode metal layer are formed on the substrate.

As shown in FIG. 16, in the embodiment of the invention, firstly the metal layer is deposited on the substrate 21, wherein the material of the substrate 21 can be glass, transparent plastic or the like. Herein, a first mask plate is used to etch away a part of the metal layer, so as to form the gate metal layer 22, the gate lead metal layer 23 and the storage capacitor electrode metal layer 24. Among them, the gate metal layer 22 is used as the gate of the pixel unit of the thin film transistor, and the storage capacitor electrode metal layer 24 is used as one electrode of the storage capacitor of the pixel unit of the thin film transistor.

Figure 17:
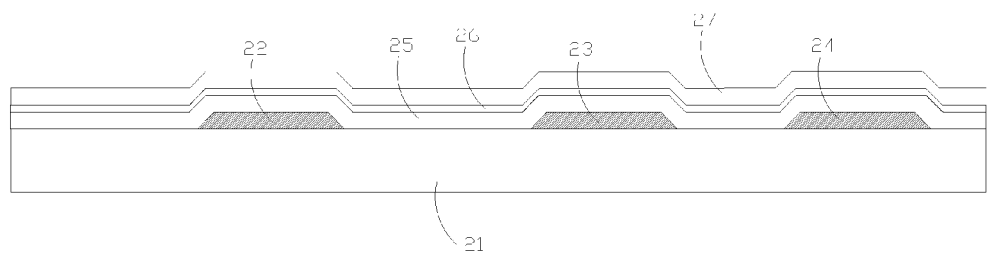
FIG. 17 is a schematic structural diagram according to the second embodiment of the present invention showing that the gate insulating layer, the metal oxide layer and the etch stop layer are deposited on the substrate, the gate metal layer, the gate lead metal layer and the storage capacitor electrode metal layer.

Next, the gate insulating layer 25, the metal oxide layer 26 and the etch stop layer 27 sequentially deposited on one side of the substrate 21 side, wherein the gate insulating layer 25, the metal oxide layer 26 and the etch stop layer 27 cover the gate metal layer 22, the gate lead metal layer 23 and the storage capacitor electrode metal layer 24 aforementioned from top to bottom, as shown in FIG. 17. Among them, the gate insulating layer 25, the metal oxide layer 26 and the etch stop layer 27 are all a transparent material, and the gate metal layer 22, the gate lead metal layer 23 and the storage capacitor electrode metal layer 24 are all made by the deposition of an opaque material, thus facilitating the exposure from the back of the substrate 21 in the later process.

Figure 18:
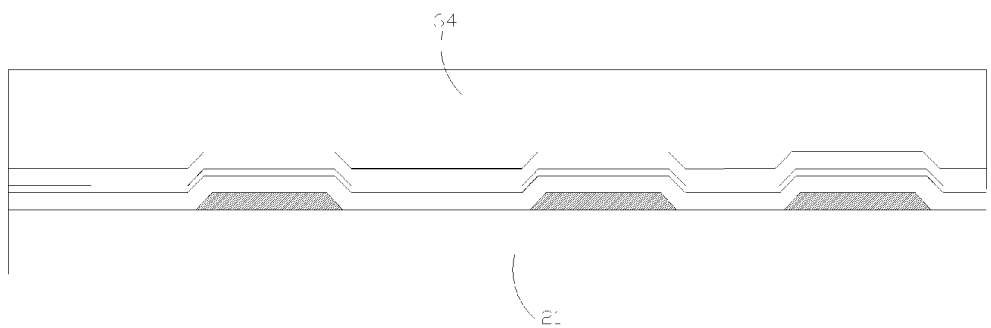
FIG. 18 is a schematic diagram according to the second embodiment of the present invention showing that the photoresist is applied to the etch stop layer.
Figure 19:
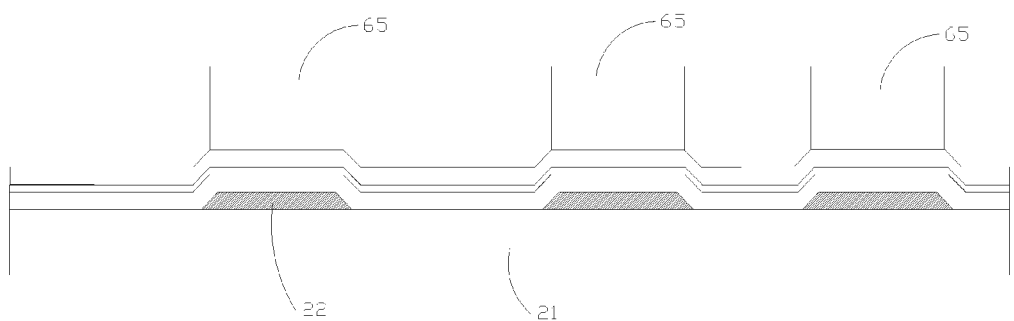
FIG. 19 is a schematic structural diagram after exposing and developing from the back of the substrate according to the second embodiment of the present invention.

Next, the photoresist 64 is applied to the etch stop layer 27, as shown in FIG. 18. Herein, the gate metal layer 22, the gate lead metal layer 23 and the storage capacitor electrode metal layer 24 are used as a mask, exposed from the back of the substrate 21, so as to expose the etch stop layer outside the gate region, the gate lead region and the storage capacitor region, as shown in FIG. 19. As the gate metal layer 22, the gate lead metal layer 23 and the storage capacitor electrode metal layer 24 are opaque, the photoresist 65 located on the gate region, the gate lead region and the storage capacitor region is retained.

Figure 20:
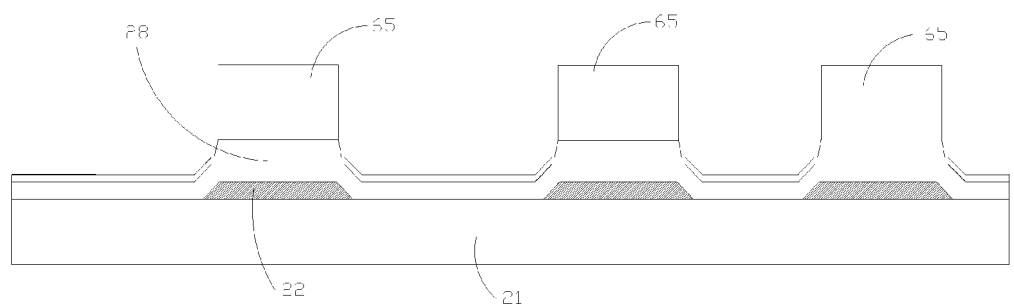
FIG. 20 is a schematic structural diagram according to the second embodiment of the present invention showing that the exposed etch stop layer is removed.

Finally, the etch stop layer outside the gate region, the gate lead region and the storage capacitor region is removed to expose the metal oxide layer aligned with the etch stop layer, and the channel 28 self-aligned with the gate 22 of the thin film transistor (i.e., the gate metal layer) is formed, as shown in FIG. 20. Here the metal oxide layer aligned with the gate 22 of the thin film transistor is directly used as the channel 28, and the process is simple.

As the unexposed metal oxide layer (i.e. the channel) is aligned with the etch stop layer located on the gate region, and the etch stop layer located on the gate region is aligned with the gate 22 of the thin film transistor, the channel 28 is precisely aligned with the gate 22 (i.e., etch stop layer located on the gate region is precisely aligned with the gate metal layer), with an edge spacing between 0~1 um, and a extremely high self-alignment precision.

In step S202, the source and drain self-aligned with the gate are formed via a metal lift-off process.

Figure 21:
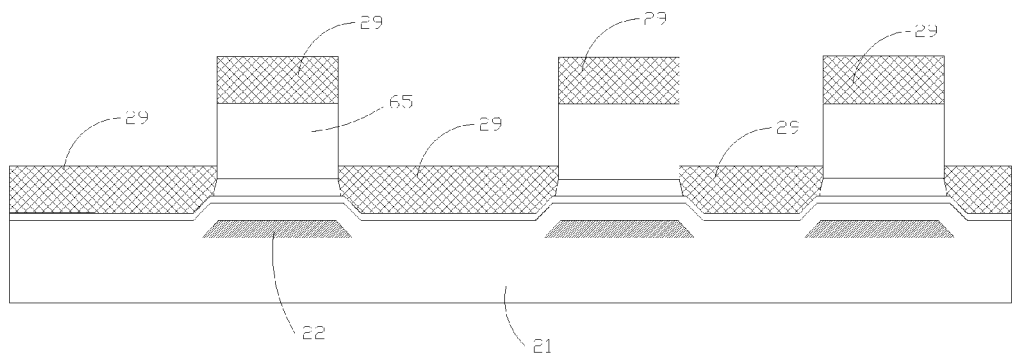
FIG. 21 is a schematic structural diagram after depositing the metal on the photoresist and both side thereof according to the second embodiment of the present invention.

As shown in FIG. 21, in the embodiment of the present invention, firstly the metal 29 is deposited on the photoresist 65 located on the gate region, the gate lead region and the storage capacitor region and both sides of each region, and the gate source and drain metals self-aligned with the gate 22 are formed on both sides of the gate region. As the source and drain metals are formed by the deposition with the side of the photoresist 65 located on the gate region as the boundary, and the etch stop layer is defined by the gate metal layer aligned with the photoresist 65, the edges of the source and drain metals are precisely aligned with the edge of the etch stop layer (i.e., the subsequently formed source and drain are self-aligned with the gate and are symmetrical), with a spacing therebetween of less than 1 um, and an extremely high self-alignment precision. As such, the overlapping area between the source and drain metals and the gate 22 can be precisely controlled at 1~2 um, which is much higher than the alignment precision of other manners. In this way, the gate metal layer 22 (i.e., gate) is used as a mask, exposed from the back of the substrate 21 to position the channel 28 of the thin film transistor and the source and drain, so that the channel 28 is self-aligned with the gate 22, and the source and drain are self-aligned with the gate 22 and are symmetrical, and the pixel unit of the thin film transistor thus manufactured has a small parasitic capacitance, the circuit manufactured therewith is fast in operation, and less prone to occurring short circuit and open circuit. In summary, in the embodiment of the present invention, the self-alignment process can minimize the overlapping between the gate 22 and the source and drain, and the channel 28 can be precisely controlled in size, thus significantly reducing the channel size, and improving the device performance.

Figure 22:
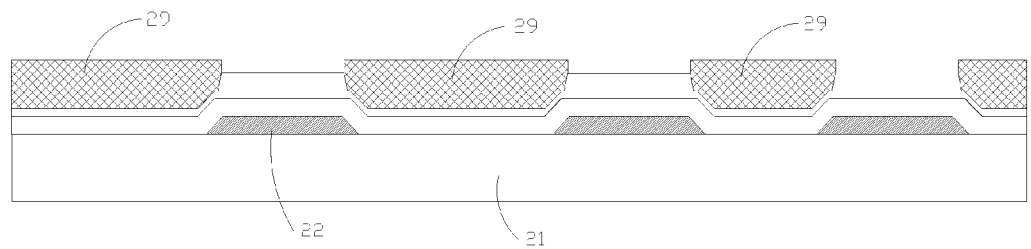
FIG. 22 is a schematic structural diagram according to the second embodiment of the present invention showing that the photoresist and the metal thereon are peeled off.

Next, the metal 29 deposited on the photoresist 65 and the photoresist 65 located on the gate region, the gate lead region and the storage capacitor region are peeled off to expose the etch stop layer located on the gate region, the gate lead region and the storage capacitor region, which refers to as a metal lift-off process, as shown in FIG. 22. Here the photoresist 65 and the metal 29 deposited thereon are removed simultaneously, so that the removal efficiency is high.

Figure 23:
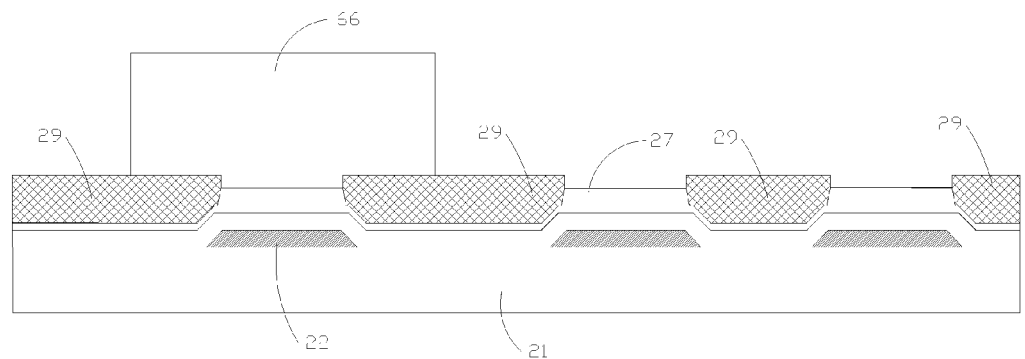
FIG. 23 is a schematic structural diagram after applying the photoresist used to cover the gate region and the source and drain regions, and exposing and developing according to the second embodiment of the present invention.

Then, the photoresist 66 used to cover the gate region and the source and drain regions is applied on one side of the substrate 21, exposed from the front side of the second mask plate, so that a part of the source and drain metals are exposed, as shown in FIG. 23. Among them, the sizes of the exposed source and drain metals depend on the sizes of the source and drain to be formed.

Figure 24:
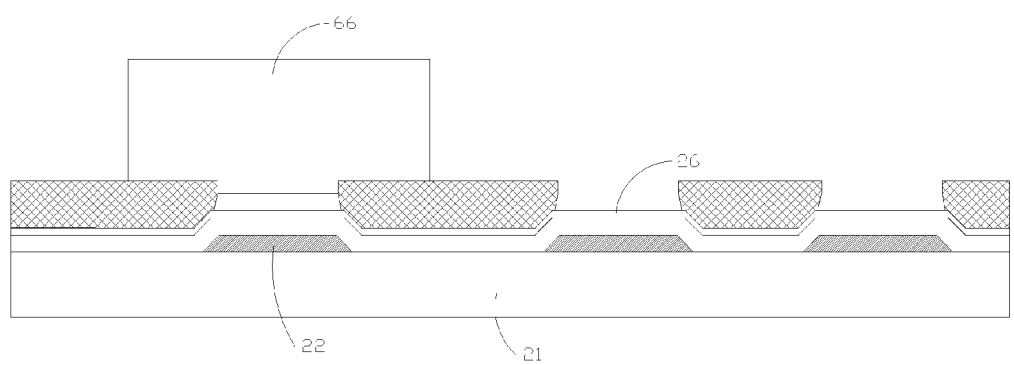
FIG. 24 is a schematic structural diagram according to the second embodiment of the present invention showing that the exposed etch stop layer is etched.
Figure 25:
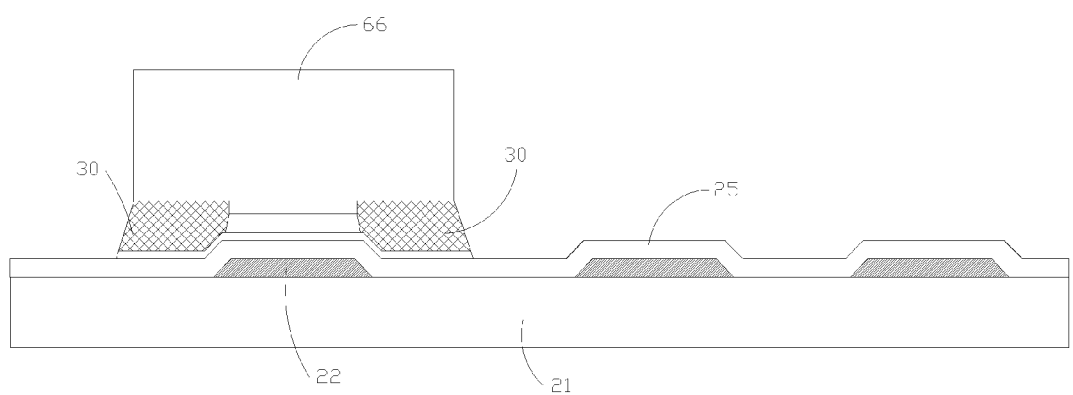
FIG. 25 is a schematic structural diagram according to the second embodiment of the present invention showing that the exposed metals and the metal oxide layer aligned with the metal are etched.
Figure 26:
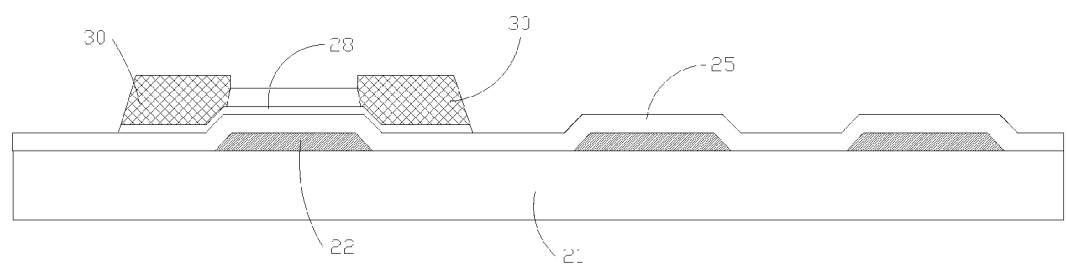
FIG. 26 is a schematic structural diagram after removing the photoresist used to cover the gate region and the source and drain regions according to the second embodiment of the present invention.

Finally, the exposed source and drain metals, the metal oxide layer aligned with the source and drain metals and the etch stop layer located on the gate lead region and the storage capacitor region, the metal oxide layer and the metal deposited on the metal oxide layer are removed so as to form the source and drain of the thin film transistor, then the photoresist covering the gate region and the source and drain regions is removed. Particularly, firstly the etch stop layer located on the gate lead region and the storage capacitor region is removed so as to expose the metal oxide layer located on the gate lead region and the storage capacitor region, as shown in FIG. 24; then the metal which is deposited on the metal oxide layer and exposed is removed so as to form the source and drain 30 of the thin film transistor, and the metal oxide layer aligned with the metal is exposed; then the exposed metal oxide layer is removed, as shown in FIG. 25; finally the photoresist 66 covering the gate region and the source and drain regions is removed, as shown in FIG. 26. It should be noted that when one side of the gate 22 is the source, the other side is the drain.

In step S203, the passivation layer is deposited, and the source and drain contact via hole leads, the gate contact via hole lead the other electrode of the storage capacitor are manufactured.

Figure 27:
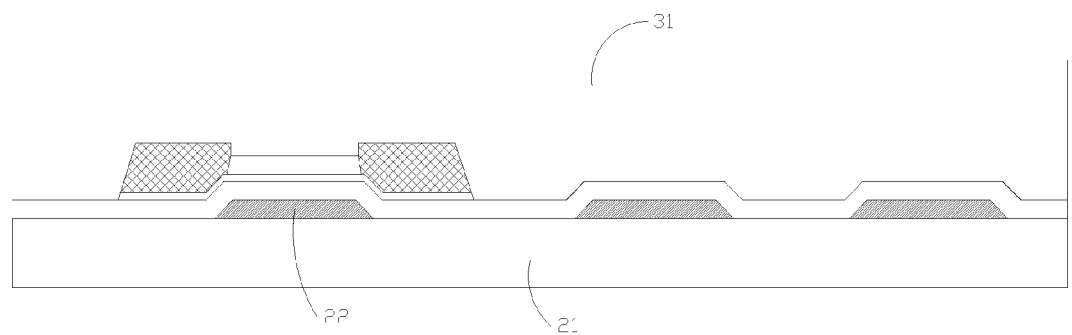
FIG. 27 is a schematic structural diagram according to the second embodiment of the present invention showing that the passivation layer is deposited on one side of the substrate.

As shown in FIG. 27, in the embodiment of the present invention, firstly the passivation layer 31 used to cover the gate region, the source and drain regions, the gate lead region and the storage capacitor region is deposited on one side of the substrate 21. The passivation layer 31 covers the source and drain 30 of the pixel unit of the thin film transistor, the etch stop layer located on the channel region and the exposed gate insulating layer.

Figure 28:
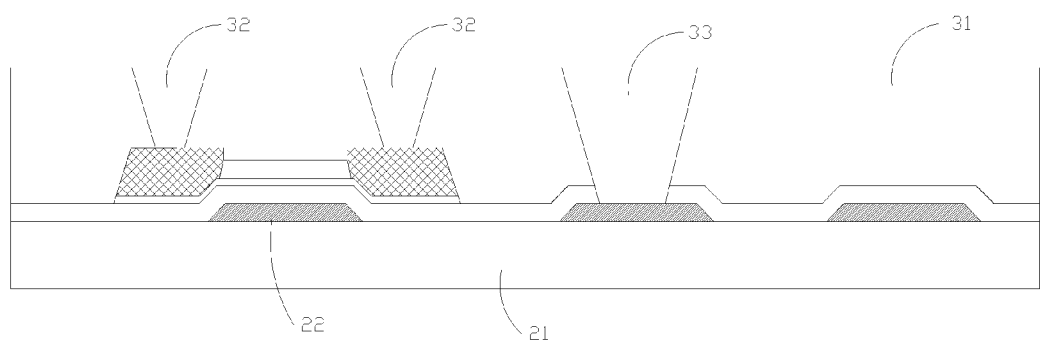
FIG. 28 is a schematic structural diagram according to the second embodiment of the present invention showing that the source and drain contact via holes and the gate contact via hole are etched on the passivation layer.

As shown in FIG. 28, in the embodiment of the present invention, an third mask plate is used to etch the passivation layer located on the source and drain regions and the gate lead region, so as to form the source and drain contact via holes 32 which are straight-through the source and drain 30 and the gate contact via hole 33. The gate insulating layer is further etched in the gate contact via hole 33, so that the electrically conductive material deposited in the later process contacts with the gate lead metal layer 23. Among them the source and drain contact via holes 32 and the gate contact via hole 33 have an inverted trapezoidal shape in cross-section, so as to facilitate filling an electrically conductive material in the later process.

Figure 29:
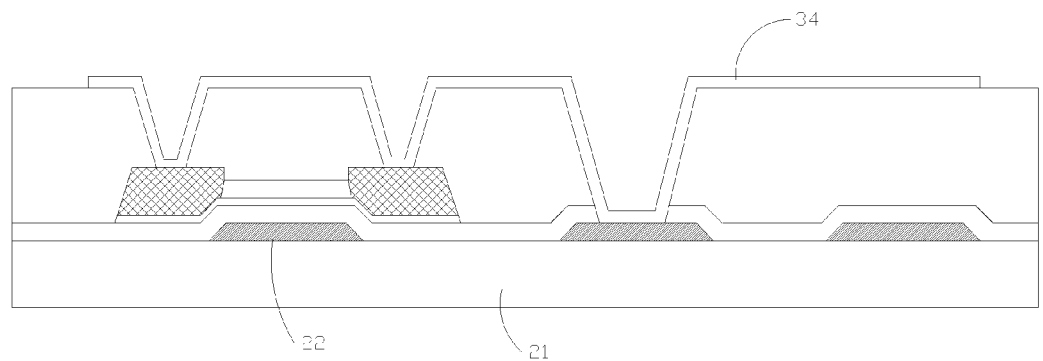
FIG. 29 is a schematic structural diagram according to the second embodiment of the present invention showing that the electrically conductive material is deposited in the source and drain contact via holes, the gate contact via hole and on the passivation layer.
Figure 30:
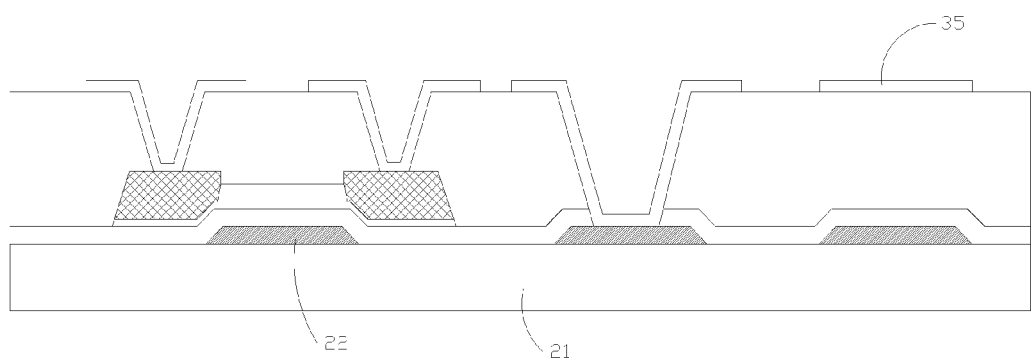
FIG. 30 is a schematic structural diagram according to the second embodiment of the present invention showing that a part of the electrically conductive material is removed via the fourth mark plate.

As shown in FIG. 29, in the embodiment of the present invention, the electrically conductive material 34 is deposited in the source and drain contact via holes 32, the gate contact via hole 33 and on the passivation layer 31 located on the storage capacitor region formed in the proceeding steps, wherein the electrically conductive material 34 can be a transparent electrically conductive material, such as ITO or the like. As shown in FIG. 30, in order to form the pixel electrode and the other electrode 35 of the storage capacitor, herein a fourth mask plate is used to carry out a photolithography. So the process for manufacturing a pixel unit of a thin film transistor only require to use of four mask sets which do not require the critical alignment, thus increasing the yield and reducing the costs.

The foregoings are merely the preferred embodiments of the present invention, and are not intended to limit the present invention, any modification, equivalent replacement, improvement, etc., made within the spirit and principle of the present invention, should be encompassed in the scope of the present invention.

The invention claimed is:

1. A method for manufacturing a thin film transistor, the method comprising:
    using a gate metal layer as a mask, exposing from the back of a substrate, and self-aligning a channel of the thin film transistor with a gate;
    forming source and drain self-aligned with the gate via a metal lift-off process; and
    depositing a passivation layer, and manufacturing source and drain contact via hole leads;
    wherein the channel is a metal oxide layer aligned with the gate of the thin film transistor; and
    the using the gate metal layer as the mask, exposing from the back of the substrate, and self-aligning the channel of the thin film transistor with the gate includes:
        forming a gate metal layer, a gate insulating layer, a metal oxide layer, and an etch stop layer on the substrate;
        applying a photoresist to the etch stop layer, using the gate metal layer as a mask, exposing from the back of the substrate to expose the etch stop layer outside the gate region, and retaining the photoresist located on the gate region; and
        removing the etch stop layer outside the gate region to expose the metal oxide layer aligned with the etch stop layer, and forming the channel self-aligned with the gate of the thin film transistor.

2. The method according to claim 1, wherein the forming source and drain self-aligned with the gate via the metal lift-off process includes:
    depositing a metal on the photoresist located on the gate region and both sides thereof simultaneously, and covering the metal on the metal oxide layer, so as to form the source and drain metals self-aligned with the gate;
    lifting off the metal deposited on the photoresist and the photoresist located on the gate region, so as to expose the etch stop layer located on the channel region;
    applying the photoresist used to cover the gate region and the source and drain regions, using a mask and exposing and developing from the front side, so as to expose a part of the source and drain metals; and
    removing the exposed source and drain metals, and the metal oxide layer aligned with the source and drain metals, so as to form the source and drain of the thin film transistor, then removing the photoresist covering the gate region and the source and drain regions.

3. The method according to claim 2, wherein the depositing the passivation layer, and manufacturing source and drain contact via hole leads includes:
    depositing a passivation layer used to cover the gate and the source and drain on one side of the substrate;
    etching the passivation layer so as to form the source and drain contact via holes; and
    depositing an electrically conductive material in the source and drain contact via holes so as to form the source and drain contact via hole leads.

4. A method for manufacturing a pixel unit of a thin film transistor, the method comprising:
    using a gate metal layer, a gate lead metal layer, and a storage capacitor electrode metal layer as a mask, exposing from the back of a substrate, and self-aligning a channel of the thin film transistor with a gate;
    forming source and drain self-aligned with the gate via a metal lift-off process; and
    depositing a passivation layer, and manufacturing the source and drain contact via hole leads, the gate contact via hole lead and the other electrode of the storage capacitor;
    wherein, the channel is the metal oxide layer aligned with the gate of the thin film transistor.

5. The method according to claim 4, wherein the using the gate metal layer, the gate lead metal layer, and the storage capacitor electrode metal layer as the mask, exposing from the back of the substrate, and self-aligning the channel of the thin film transistor with the gate includes:
    manufacturing a metal layer on a substrate, and forming a gate metal layer, a gate lead metal layer, and a storage capacitor electrode metal layer by photolithography;
    depositing a gate insulating layer, a metal oxide layer, and an etch stop layer used to cover the gate metal layer, the gate lead metal layer, and the storage capacitor electrode metal layer sequentially on one side of the substrate;
    applying a photoresist to the etch stop layer, using the gate metal layer, the gate lead metal layer, and the storage capacitor electrode metal layer as a mask, exposing and developing from the back the substrate to expose the etch stop layer outside the gate region, the gate lead region and the storage capacitor region, and retaining the photoresists located on the gate region, the gate lead region and the storage capacitor region; and
    removing the etch stop layer outside the gate region, the gate lead region, and the storage capacitor region to expose the metal oxide layer aligned with the etch stop layer, and forming the channel self-aligned with the gate of the thin film transistor.

6. The method according to claim 5, wherein the forming source and drain self-aligned with the gate via the metal lift-off process includes:
    depositing a metal on the photoresist located on the gate region, the gate lead region and the storage capacitor region and both sides of each region simultaneously, and covering the metal on the metal oxide layer so as to form source and drain metals self-aligned with the gate on both sides of the gate region;

lifting off the metal deposited on the photoresist and the photoresist located on the gate region, the gate lead region and the storage capacitor region simultaneously to expose the etch stop layer located on the gate region, the gate lead region and the storage capacitor region;

applying a photoresist used to cover the gate region and the source and drain regions, exposing and developing from the front side of a mask plate, so as to expose a part of the source and drain metals; and removing the exposed source and drain metals, the metal oxide layer aligned with the source and drain metals and the etch stop layer located on the gate lead region and the storage capacitor region, and the metal oxide layer and the metal deposited on the metal oxide layer so as to form the source and drain of the thin film transistor, then removing the photoresist covering the gate region and the source and drain regions.

7. The method according to claim 6, wherein the depositing the passivation layer, and manufacturing the source and drain contact via hole leads, the gate contact via hole lead and the other electrode of the storage capacitor includes:

depositing the passivation layer used to cover the gate region, the source and drain regions, the gate lead region, and the storage capacitor region on one side of the substrate;

etching the passivation layer so as to form source and drain contact via holes and gate contact via hole; and depositing an electrically conductive material in the source and drain contact via holes, the gate contact via hole and on the passivation layer located on the storage capacitor region so as to form the source and drain contact via hole leads, the gate contact via hole lead and the other electrode of the storage capacitor.

8. The method according to claim 6, wherein the removing the exposed source and drain metals, the metal oxide layer aligned with the source and drain metals, and the etch stop layer located on the gate lead region and the storage capacitor region, the metal oxide layer and the metal deposited on the metal oxide layer so as to form the source and drain of the thin film transistor, then removing the photoresist covering the gate region and the source and drain regions includes:

removing the etch stop layer located on the gate lead region and the storage capacitor region, to expose the metal oxide layer located on the gate lead region and the storage capacitor region;

removing the metal which is deposited on the metal oxide layer and exposed so as to form the source and drain of the thin film transistor, and exposing the metal oxide layer aligned with the metal;

removing the exposed metal oxide layer; and removing the photoresist covering the gate region and the source and drain regions.

\* \* \* \* \*